(12) United States Patent
Komposch et al.

(10) Patent No.: US 12,392,821 B2
(45) Date of Patent: Aug. 19, 2025

(54) THERMAL AND ELECTRICAL CONDUCTIVITY BETWEEN METAL CONTACTS UTILIZING SPRING PIN CONNECTORS

(71) Applicant: Wolfspeed, Inc., Durham, NC (US)

(72) Inventors: Alexander Komposch, Morgan Hill, CA (US); Jason R. Fender, Chandler, AZ (US); Eric Jacob Palsgaard, Morgan Hill, CA (US); Douglas John Kroon, Morgan Hill, CA (US); Matthew Kirke Mellor, Hollister, CA (US); Donald I. Fowlkes, San Jose, CA (US)

(73) Assignee: WOLFSPEED, INC., Durham, NC (US)

( * ) Notice: Subject to any disclaimer, the term of this patent is extended or adjusted under 35 U.S.C. 154(b) by 215 days.

(21) Appl. No.: 18/332,344

(22) Filed: Jun. 9, 2023

(65) Prior Publication Data

US 2024/0410939 A1     Dec. 12, 2024

(51) Int. Cl.
| | | |
|---|---|---|
| *G01R 31/28* | (2006.01) | |
| *H01L 23/34* | (2006.01) | |
| *H01R 12/71* | (2011.01) | |
| *H01R 13/24* | (2006.01) | |

(52) U.S. Cl.
CPC ..... *G01R 31/2896* (2013.01); *G01R 31/2884* (2013.01); *H01L 23/34* (2013.01); *H01R 12/716* (2013.01); *H01R 13/2471* (2013.01)

(58) Field of Classification Search
CPC . G01R 31/2884; G01R 31/2896; H01L 23/34; H01L 2924/181; H01L 2223/6644; H01L 2924/14; H01L 2224/48227; H01L 24/49; H01L 24/32; H01L 2224/73204; H01L 2924/1306; H01L 23/481; H01L 2225/06541; H01L 23/3677; H01L 24/13; H01R 12/716; H01R 13/247; H01R 13/2471

See application file for complete search history.

(56) References Cited

U.S. PATENT DOCUMENTS

| | | | | |
|---|---|---|---|---|
| 5,198,752 | A * | 3/1993 | Miyata | G01R 31/2875 324/750.08 |
| 6,020,257 | A * | 2/2000 | Leedy | G03F 7/70483 438/626 |
| 6,118,286 | A | 9/2000 | Fredrickson | |
| 7,724,004 | B2 * | 5/2010 | Eldridge | G01R 31/2889 324/755.01 |
| 7,888,954 | B1 | 2/2011 | Mardi | |

(Continued)

FOREIGN PATENT DOCUMENTS

KR     100706228     4/2007

*Primary Examiner* — Vinh P Nguyen

(74) *Attorney, Agent, or Firm* — Dority & Manning, P.A.

(57) ABSTRACT

In one example, a system includes a semiconductor package having a metal contact. The system includes a metal submount. The metal submount includes a plurality of spring pin connectors embedded in the metal submount, the plurality of spring pin connectors being thermally and electrically connected to one another through the metal submount. The metal contact of the semiconductor package is thermally and electrically coupled to the metal submount through the plurality of spring pin connectors.

19 Claims, 8 Drawing Sheets

(56) References Cited

U.S. PATENT DOCUMENTS

| | | | | |
|---|---|---|---|---|
| 8,338,937 B2* | 12/2012 | Elliott | .................. | H01L 23/045 |
| | | | | 257/E23.024 |
| 8,441,271 B2* | 5/2013 | Kitazume | .......... | G01R 1/06761 |
| | | | | 324/754.01 |
| 8,736,294 B2* | 5/2014 | Chang | ................ | G01R 1/07378 |
| | | | | 324/756.03 |
| 8,823,407 B2* | 9/2014 | Shah | ...................... | G01R 31/52 |
| | | | | 324/756.01 |
| 9,063,170 B2 | 6/2015 | Caradonna et al. | | |
| 11,573,262 B2 | 2/2023 | Ranganathan et al. | | |
| 2016/0003889 A1* | 1/2016 | Watanabe | .......... | G01R 31/2632 |
| | | | | 438/15 |

* cited by examiner

THERMAL AND ELECTRICAL CONDUCTIVITY BETWEEN METAL CONTACTS UTILIZING SPRING PIN CONNECTORS

FIELD

The present disclosure relates generally to device packages, and more particularly to improved thermal and electrical conductivity between metal contacts for semiconductor device packages.

BACKGROUND

Semiconductor devices such as transistors and diodes are ubiquitous in modern electronic devices. Wide band gap semiconductor material systems such as gallium arsenide (GaAs), gallium nitride (GaN), and silicon carbide (SiC) are being increasingly utilized in semiconductor devices to push the boundaries of device performance in areas such as switching speed, power handling capability, and thermal conductivity. Power semiconductor devices are widely used to carry large currents, support high voltages and/or operate at high frequencies such as radio frequencies. A wide variety of power semiconductor devices are available for different applications including, for example, power switching devices and power amplifiers. Many power semiconductor devices are implemented using various types of field effect transistors (FETs) devices including MOSFETs (metal-oxide semiconductor field-effect transistors), DMOS (double-diffused metal-oxide semiconductor) transistors, HEMTs (high electron mobility transistors), MESFETs (metal-semiconductor field-effect transistors), LDMOS (laterally diffused metal-oxide semiconductor) transistors, etc.

SUMMARY

Aspects and advantages of embodiments of the present disclosure will be set forth in part in the following description, or may be learned from the description, or may be learned through practice of the embodiments.

One example embodiment of the present disclosure is directed to system. The system includes a semiconductor package having a metal contact. The system includes a metal submount. The metal submount includes a plurality of spring pin connectors embedded in the metal submount, the plurality of spring pin connectors being thermally and electrically connected to one another through the metal submount. The metal contact of the semiconductor package is thermally and electrically coupled to the metal submount through the plurality of spring pin connectors.

Another example embodiment of the present disclosure is directed to a testing apparatus for a power semiconductor package. The testing apparatus includes a metal submount. The testing apparatus includes a plurality of spring pin connectors embedded in the metal submount. The plurality of spring pin connectors may be thermally and electrically connected to one another through the metal submount.

Another example embodiment of the present disclosure is directed to a method. The method includes mounting a semiconductor package including a metal contact to a metal submount. The metal submount includes a plurality of spring pin connectors embedded in the metal submount. The plurality of spring pin connectors may be thermally and electrically connected to one another through the metal submount.

These and other features, aspects and advantages of various embodiments will become better understood with reference to the following description and appended claims. The accompanying drawings, which are incorporated in and constitute a part of this specification, illustrate embodiments of the present disclosure and, together with the description, explain the related principles.

BRIEF DESCRIPTION OF THE DRAWINGS

Detailed discussion of embodiments directed to one of ordinary skill in the art are set forth in the specification, which refers to the appended figures, in which.

DETAILED DESCRIPTION

Figure 1A:
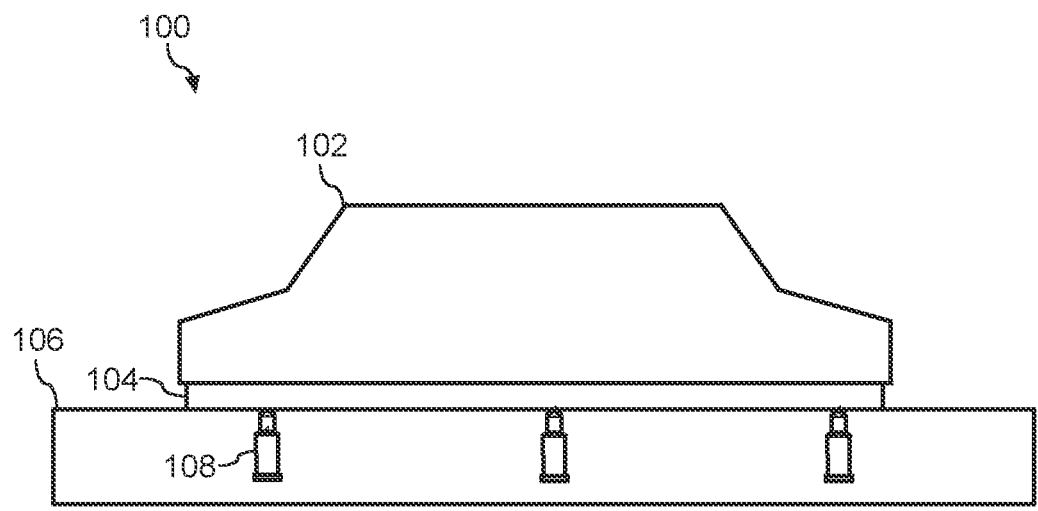
FIGS. 1A-1B depict an example system according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Semiconductor packages have been developed that include semiconductor devices, such as one or more power MOSFETs, HEMTs, or Schottky diodes. Such semiconductor packages may be employed in a variety of applications to enable higher switching frequencies along with reduced associated losses, higher blocking voltages, and improved avalanche capabilities. Example applications may include high performance industrial power supplies, server/telecom power, electric vehicle charging systems, energy storage systems, uninterruptible power supplies, high-voltage DC/DC converters, electric vehicles, and battery management systems. HEMTs fabricated in Group III nitride-based material systems may have the potential to generate large amounts of radio frequency (RF) power because of the combination of material characteristics that includes high breakdown fields, wide band gaps, large conduction band offset, and/or high saturated electron drift velocity. As such, Group III nitride-based HEMTs may be promising candidates for high frequency and/or high-power RF applications (as well as for low frequency high power switching applications) as discrete transistors or as coupled with other circuit elements, such as in monolithic microwave integrated circuit (MMIC) devices.

A semiconductor package can house one or more semiconductor devices (e.g., MOSFETs, HEMTs, Schottky diodes) in a standalone housing that can be mounted to a larger structure, such as a submount that forms a part of a testing apparatus or a part of clamp down structure for the semiconductor package in operation. Some semiconductor packages include a planar metal contact that is mounted to a planar submount during testing and/or operation of the semiconductor package. The submount may provide, for example, an electrical reference (e.g., ground reference) and/or thermal cooling to the semiconductor package.

Achieving good thermal and/or electrical conductivity between two metal plates mounted in parallel can be challenging due to manufacturing variances (e.g., even within tolerances), roughness, and/or other imperfections in the metal plates. For instance, an electronic component and its respective socket may include metal plates that do not perfectly mate, resulting in suboptimal thermal and/or electrical conductivity. As used herein, a "planar" contact, plate, or other structure refers to a structure having at least one surface that generally defines a plane. For instance, the surface may have a variation in depth of less than about 10%, such as less than about 1%. A planar contact may also be a portion of a larger structure, which may be planar or non-planar.

One existing approach to achieve high electrical conductivity between two parallel metal plates is to employ thermal paste or other soft metal materials to fill imperfections between the metal plates. Although this approach improves electrical conductivity, these filler materials are typically poor thermal conductors. Furthermore, in the case of warping, roughness, or other imperfection(s) in a metal contact or submount, the impedance of the connection can vary, which can lead to performance loss due to the inconsistence impedance.

Examples of the present disclosure provide a solution for these and other problems by incorporating spring pin connectors into a metal submount. The spring pin connectors can be, for example, so-called "pogo pins" or other suitable spring pin connectors. The spring pin connectors can include at least two segments connected by a spring such that, when one segment is fixed, the spring forces a second segment to extend, typically up to a maximum extension permitted by the spring pin connector. If the spring pin connector is disposed adjacent to a surface, the spring can force the second segment to extend to contact the surface.

When the metal submount is mounted to a metal contact (e.g., of a semiconductor package), the spring pin connectors can improve contact points between the metal submount and the metal contact. For instance, the spring pin connectors can be made of and/or plated with a highly-conductive metal, such as copper, gold, silver, aluminum, etc., and/or other suitable conductive material such that the spring pin connectors are highly thermally and electrically conductive. The spring pin connectors can be incorporated into a larger submount and electrically coupled to that submount, thereby providing similar electrical connectivity as if the submount was in direct contact with the contact of the semiconductor package. The use of spring pin connectors can provide quality electrical contact between the submount and the contact of the semiconductor package, regardless of imperfections or tolerances on the spring pin connectors. This, in turn, can provide a consistent impedance or other electrical quality for circuits that depends on quality electrical contact for consistent electrical performance, such as, for example, power or RF applications. Furthermore, the use of plated spring pin connectors can avoid substantial costs associated with plating an entire submount (e.g., a heat sink), which can be large and therefore costly to plate.

One example embodiment of the present disclosure is directed to a testing apparatus, such as a testing apparatus for a semiconductor package. The testing apparatus can include a metal submount and a plurality of spring pin connectors embedded in the metal submount. The plurality of spring pin connectors can be thermally and electrically connected to one another through the metal submount. For instance, the metal submount can be or can include a metal plate, and the plurality of spring pin connectors can be embedded in (e.g., disposed in) the metal submount. In some implementations, a clamp, brace, or other structure can mount the semiconductor package to the metal submount. The clamp, brace, or other structure can additionally be configured to place the metal contact into electrical communication with the plurality of spring pin connectors.

The testing apparatus can be used to test semiconductor packages that may be used in power applications and/or radiofrequency (RF) applications, such as HEMTs. For instance, in some embodiments, the testing apparatus can be used to test high-power RF amplifiers. In some existing RF testing apparatuses, the high-power RF amplifiers may be tested in a "clamp-down" fixture where a semiconductor package is clamped to the testing apparatus. Inconsistency from fixture to fixture and/or package to package can lead to poor electrical contact. Additionally or alternatively, the high-power RF amplifiers may be tested using a test socket assembly. The socket design may have poor thermal conductivity and may not be beneficial for RF matching.

According to example aspects of the present disclosure, the testing apparatus can include a metal submount including a plurality of spring pin connectors. The metal submount can be a portion of the testing apparatus, such as a base, a heat sink, a reference, etc. For instance, in some implementations, the spring pin connectors can be incorporated directly into an electrical reference and/or heat sink of the testing apparatus.

Additionally or alternatively, the metal submount can be a metal insert. The metal insert can include the one or more spring pin connectors. The metal insert can be connected to a larger portion (e.g., a base plate) of the testing apparatus. For instance, in some embodiments, the metal insert can be disposed in a groove provided between two circuit boards in the RF testing apparatus. In some embodiments, the metal insert can be removably affixed to the testing apparatus, such as by one or more screws. In some further embodiments, the metal insert can be exchanged with other metal inserts having a same or similar footprint and/or different configurations (e.g., arrangements, types, fits, etc.) of spring pin connectors such that the RF testing apparatus can accommodate semiconductor packages having different arrangements of metal contacts.

In some examples, a semiconductor package may be mounted to a metal submount for use in operation of the semiconductor package, such as for a high frequency and/or high-power radiofrequency application. For instance, the semiconductor package may be a channel mount semiconductor package that gets bolted or soldered into a channel or onto another metal submount. The semiconductor package may include, for instance, one or more wideband gap semiconductor devices, such as one or more silicon carbide-based MOSFETs, one or more silicon carbide-based Schottky diodes, one or more Group III-nitride based HEMTs, or other devices. The metal submount may include a plurality of spring pin connectors embedded in the metal submount. The plurality of spring pin connectors can be thermally and electrically connected to one another through the metal submount. For instance, the metal submount can be or can include a metal plate, and the plurality of spring pin connectors can be embedded in (e.g., disposed in) the metal submount. In some implementations, a clamp, brace, or other structure can mount the semiconductor package to the metal submount. The clamp, brace, or other structure can additionally be configured to place the metal contact into electrical communication and/or thermal communication with the plurality of spring pin connectors.

Aspects of the present disclosure provide a number of technical effects and benefits. For instance, the present inventors have discovered that the use of spring pin connectors incorporated into solid metal plates (e.g., as opposed to simply conveying a signal at a single, particular point) provides improvements to electrical and thermal conductivity between parallel-mounted metal plates (or other substantially planar metal structures). The spring pin connectors can provide quality electrical contact between the plates regardless of imperfections or tolerances on the spring pin connectors. This, in turn, can provide a consistent impedance or other electrical quality for circuits that depends on quality electrical contact for consistent electrical performance, such as, for example, power or RF applications. Furthermore, the use of plated spring pin connectors can avoid substantial costs associated with plating an entire submount (e.g., a heat sink), which can be large and therefore costly to plate.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the present disclosure are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Similarly, it will be understood that variations in the dimensions are to be expected based on standard deviations in manufacturing procedures. As used herein, "approximately" or "about" includes values within 10% of the nominal value.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

Some embodiments of the invention are described with reference to semiconductor layers and/or regions which are characterized as having a conductivity type such as n type or p type, which refers to the majority carrier concentration in the layer and/or region. Thus, N type material has a majority equilibrium concentration of negatively charged electrons, while P type material has a majority equilibrium concentration of positively charged holes. Some material may be designated with a "+" or "-" (as in N+, N−, P+, P−, N++, N−−, P++, P−−, or the like), to indicate a relatively larger ("+") or smaller ("−") concentration of majority carriers compared to another layer or region. However, such notation does not imply the existence of a particular concentration of majority or minority carriers in a layer or region.

Some aspects of the present disclosure are discussed with reference to particular transistor devices, such as an HEMT transistor device, for purposes of illustration and discussion. Those of ordinary skill in the art, using the disclosures provided herein, will appreciate that certain aspects of the present disclosure may be applicable to semiconductor packages having other semiconductor devices without deviating from the scope of the present disclosure, such as silicon carbide-based MOSFETS, silicon carbide-based Schottky diodes, or other devices.

Some aspects of the present disclosure are discussed with reference to particular applications, such as radiofrequency applications, power or high-power applications, etc. for purposes of illustration and discussion. Those of ordinary skill in the art, using the disclosures provided herein, will appreciate that certain aspects of the present disclosure may be applicable to other fields and technologies without deviating from the scope of the present disclosure. For instance, aspects of the present disclosure may be implemented for power electronics applications, radio frequency applications, radiofrequency test circuits, package testing, DC test circuits, consumer electronics, electric vehicles, energy storage, and/or other technologies without departing from the scope of the present disclosure.

In the drawings and specification, there have been disclosed typical embodiments and, although specific terms are employed, they are used in a generic and descriptive sense only and not for purposes of limitation of the scope set forth in the following claims.

With reference now to the Figures, example embodiments of the present disclosure will now be set forth.

Figure 1B:
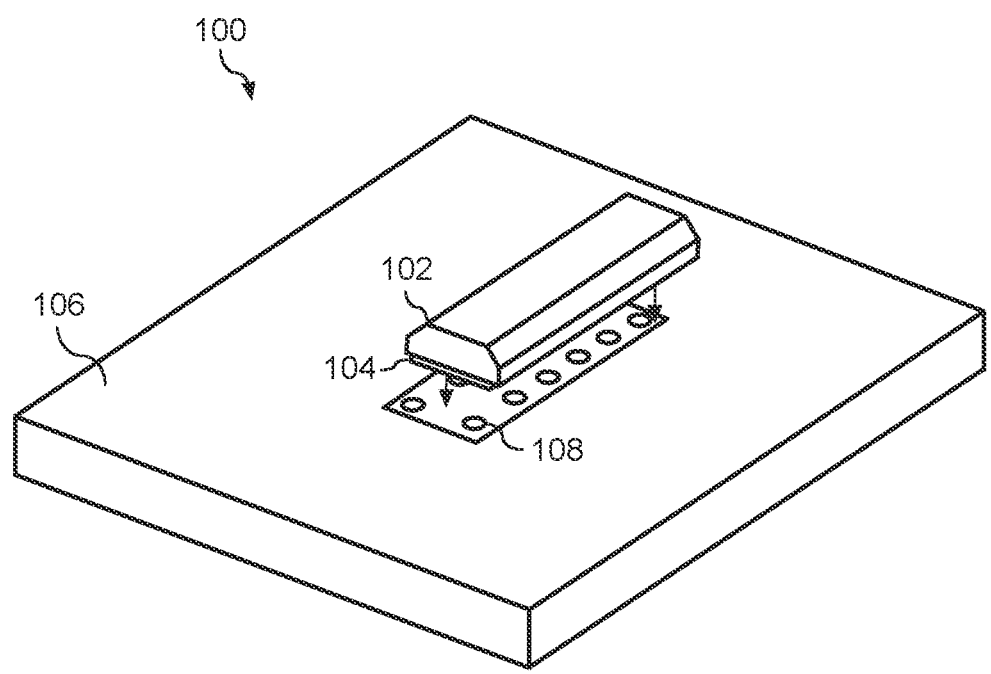

FIGS. 1A and 1B depict an example system 100 according to example embodiments of the present disclosure. The system 100 includes a semiconductor package 102 mounted to a metal submount 106. For instance, FIG. 1A depicts a cross-sectional view of the system 100. FIG. 1B depicts a perspective view of the system 100. The semiconductor package 102 can be any suitable semiconductor package 102 including one or more semiconductor devices, such as transistors, diodes, etc. For instance, in some embodiments, the semiconductor package 102 can be or can include a wide band gap semiconductor-based power semiconductor device. In some embodiments, for example, the semiconductor package 102 can include one or more silicon-carbide MOSFETs. In some embodiments, the semiconductor package 102 can include one or more Group III-nitride devices. The one or more Group-III-nitride-based devices can include, for example, one or more Group III-nitride HEMTs.

The semiconductor package 102 can include a metal contact 104. The metal contact 104 can be a metallization layer (e.g., backside metallization layer) associated with the semiconductor package. The metal contact 104 may be used to provide an electrical connection (e.g., reference or ground connection) for the semiconductor package 102. The metal contact 104 may be a thermal cooling layer for the semiconductor package 102 (e.g., for coupling to a heat sink). The metal contact 104 can be any suitable metal, such as a conductive metal, such as, for example, copper, gold, silver, aluminum, etc. Additionally or alternatively, the metal contact 104 can include a metal alloy or a conductive nonmetal without deviating from the scope of the present disclosure.

The metal submount 106 can be any suitable metal, such as a conductive metal, such as, for example, copper, gold, silver, aluminum, etc. Additionally or alternatively, the metal submount 106 can include a metal alloy or a conductive nonmetal without departing from the scope of the present disclosure. The metal contact 104 can be a planar metal contact. For instance, a depth of the metal contact 104 can have a variation of less than about 10%, such as less than about 1%. As another example, the metal contact 104 can have a surface (e.g., a bottom surface) substantially resembling a plane.

The metal contact 104 can be configured to provide electrical and/or thermal coupling for the semiconductor package 102. For instance, in some implementations, the metal contact 104 can be (and/or can be coupled to) a cooling pad associated with the semiconductor package 102. Additionally or alternatively, the metal contact 104 can be associated with (e.g., coupled to, configured to provide, etc.) an electrical reference connection for the semiconductor package 102. For instance, in some embodiments, the metal contact 104 can be associated with an electrical ground for the semiconductor package 102.

The metal contact 104 can have a surface area relative to a surface area of a surface of the semiconductor package 102. For instance, the metal contact 104 can occupy some or all of the surface of the semiconductor package 102 on which the metal contact 104 is disposed. For example, in some embodiments, the metal contact 104 may have a surface area that is about equivalent to (e.g., greater than about 90% of) a surface area of a surface of the semiconductor package 102. As another example, in some embodiments, the metal contact 104 may have a surface area of at least about 75% of a surface area of a surface of the semiconductor package 102. As another example, in some embodiments, the metal contact 104 may have a surface area of at least about 50% of a surface area of a surface of the semiconductor package 102.

The metal submount 106 can include a plurality of spring pin connectors 108. The spring pin connectors 108 can be embedded in the metal submount 106. For instance, in some embodiments, the spring pin connectors 108 can be disposed in holes, bores, or other cavities that are drilled or otherwise formed in the metal submount 106. The metal submount 106 and the spring pin connectors 108 can be in direct electrical connection with one another through the metal submount. For instance, the spring pin connectors 108 can be thermally and/or electrically connected to one another through the metal submount. For instance, rather than electrically isolating (e.g., by one or more insulators) the spring pin connectors 108, each spring pin connector 108 can share a common electrical connection, such as an electrical reference. Therefore, the spring pin connectors 108 can facilitate improved conductivity between the metal submount 106 and the metal contact 104 (e.g., rather than conveying individual signals).

The metal submount 106 can be a portion of a larger circuit incorporating the semiconductor package 102. For example, the metal submount 106 can be a socket for the semiconductor package 102. The metal submount 106 can provide thermal and/or electrical connectivity between the metal contact 104, other portions of a larger circuit, and/or the environment of the semiconductor package 102 (e.g., for heat dissipation).

In some embodiments, the metal submount 106 can be a heatsink. Additionally or alternatively, in some embodiments, the metal submount 106 can be configured to regulate (e.g., raise and/or lower) a temperature of the semiconductor package. For instance, the metal submount 106 may couple the metal contact 104 to a heat source or sink (not shown) to regulate the temperature of the semiconductor package 102 to transfer heat to or from the semiconductor package 102. As one example, the metal submount 106 may be operable to transfer heat to the semiconductor package 102 to raise a junction temperature of the one or more transistor cells in the semiconductor package 102 to a test temperature for use in a testing apparatus.

In some embodiments, the metal submount 106 can provide an electrical reference connection for the semiconductor package 102. For instance, in some embodiments, the metal submount 106 can be and/or can provide an electrical ground for the semiconductor package 102. In some embodiments, the metal submount 106 can be and/or can provide power for the semiconductor package 102.

In some embodiments, electrical leads 122 (illustrated in FIGS. 2A-2B) can be included in the semiconductor package 102. The electrical leads 122 can couple the semiconductor package 102 to other components of a circuit such as, for example, one or more signal lines on one or more printed circuit boards (PCBs).

In some embodiments, the metal contact 104 of the semiconductor package 102 can be thermally and/or electrically coupled to the metal submount 106 without use of a thermal paste or other medium between the metal contact 104 and the metal submount 106, such without the use of a liquid metal, metal foil (e.g., Indium metal foil), interposer, thermal interface material, water, and/or other medium For instance, the spring pin connectors 108 can provide quality contact facilitating thermal and/or electrical coupling between the metal contact 104 and the metal submount 106 without requiring the use of thermal paste or other medium between the metal contact 104 and the metal submount 106.

Figure 2A:
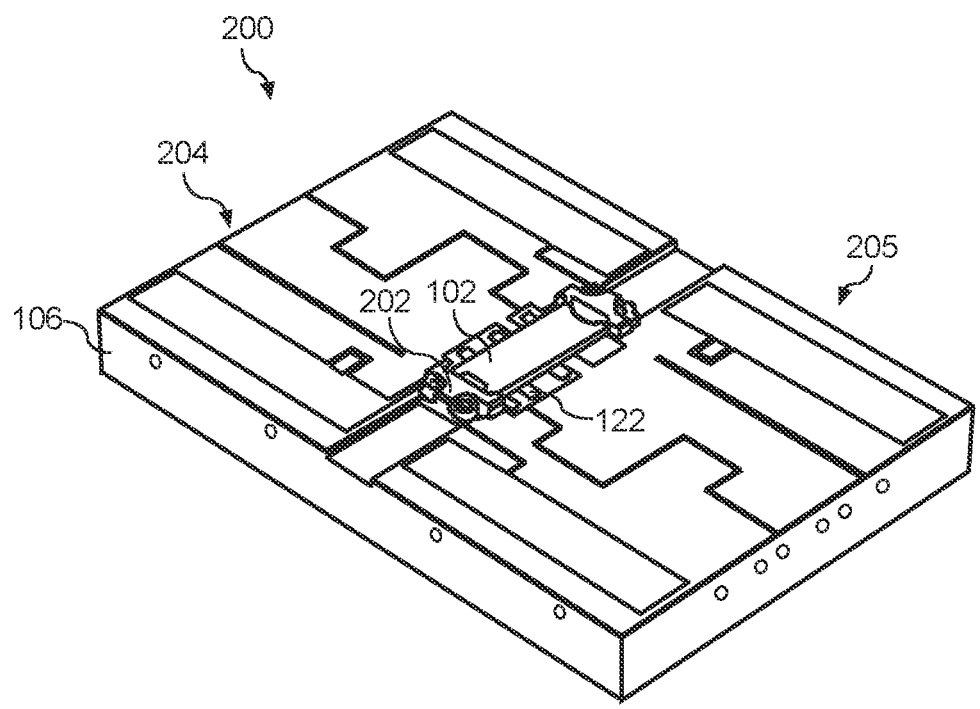
FIGS. 2A-2C depict an example system according to example embodiments of the present disclosure.
Figure 2B:
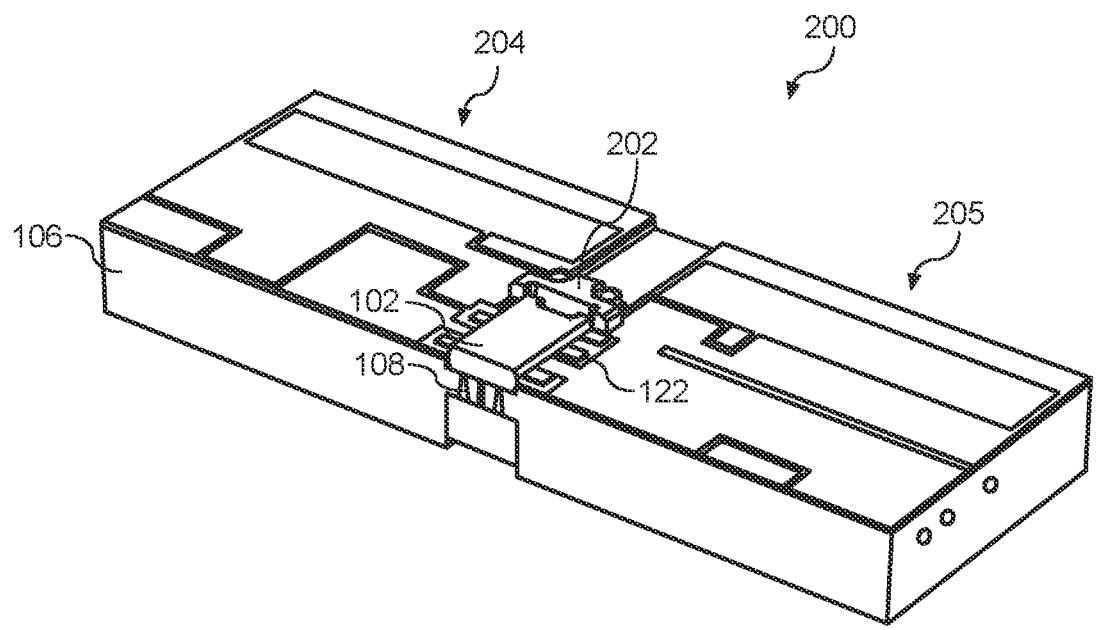
Figure 2C:
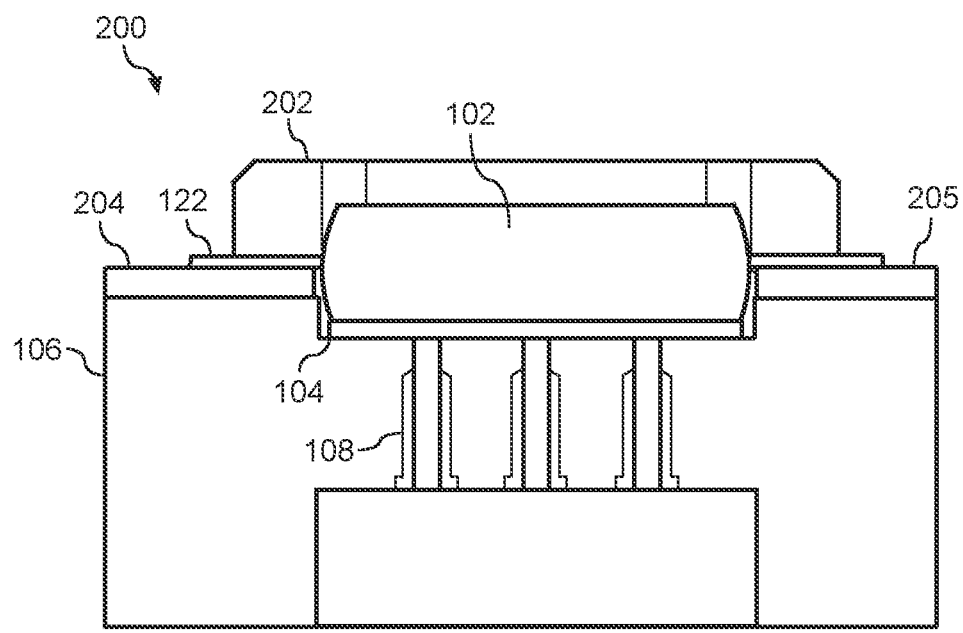

FIGS. 2A-2C depict an example system 200 according to example embodiments of the present disclosure. For instance, FIG. 2A depicts a perspective view of the example system 200. FIG. 2B depicts a cutaway perspective view of the example system 200 showing the spring pin connectors 108. FIG. 2C depicts a cross-sectional view of the example system 200.

The example system 200 includes the semiconductor package 102 and metal submount 106 incorporated into a larger apparatus. For instance, the example system 200 can be a testing apparatus and/or portion thereof. As illustrated in FIGS. 2A-2C, the semiconductor package 102 can be clamped down to the metal submount 106 by a clamp 202. For instance, the semiconductor package 102 can be a clamp-down power semiconductor package. The clamp 202 can be any suitable clamp. In some embodiments, additionally to or alternatively to clamp 202, the semiconductor package 102 can be attached to or secured to the metal submount 106 by any suitable manner.

The metal submount 106 can be disposed adjacent one or more circuit boards. For instance, in the example system 200, the metal submount 106 is disposed adjacent a first circuit board 204 and a second circuit board 205. The first circuit board 204 and/or the second circuit board 205 can be any suitable circuit board, such as, for example, a printed circuit board (PCB) and may include one or more signal traces for coupling to the semiconductor package 102.

In some embodiments, the first circuit board 204 and/or the second circuit board 205 can be provided in an RF testing apparatus. For instance, the first circuit board 204 and/or the second circuit board 205 can provide RF testing functionality for the semiconductor package 102. As one example, the circuit boards 204, 205 can simulate operation of a circuit implementing the semiconductor package 102. As another example, the circuit boards 204, 205 can test the semiconductor package 102 under various loads, frequencies, temperatures, impulses, or other test conditions.

In some embodiments, the semiconductor package 102 can include one or more electrical leads 122 connected to the circuit boards 204, 205. The electrical leads 122 can provide connectivity between the circuit boards 204, 205 (e.g., between traces on the circuit boards 204, 205) and semiconductor devices in the semiconductor package 102. For example, the leads 122 can be mated with traces on the circuit boards 204, 205 when the semiconductor package 102 is mounted to the metal submount 106. The leads 122 can be formed of any suitable material, such as aluminum, steel, gold, copper, or other suitable metal, or other suitable conductive material.

As shown in FIG. 2C, the spring pin connectors 108 provide an electrical and/or a thermal connection between the metal contact 104 and the metal submount 106. For instance, the metal contact 104 may be compressed against the spring pin connectors 108 to provide an electrical and/or thermal connection between the metal contact 104 and the metal submount 106.

Figure 3:
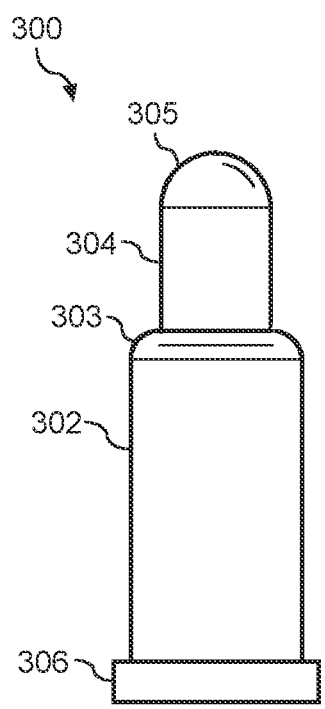
FIG. 3 depicts an example spring pin connector according to example embodiments of the present disclosure.

FIG. 3 depicts an example spring pin connector 300 according to example embodiments of the present disclosure. The spring pin connector 300 can include a first segment 302 and a second segment 304. The spring pin connector 300 can be configured such that a spring (not illustrated) forces the second segment 304 outward from the first segment 302 when a force is not present on the tip 305 of the second segment 304. For instance, the spring can be disposed within the first segment 302 and/or the second segment 304. As one example, the spring can be disposed between tip 305 and base 306. A rim 303 can be configured to block extension of the second segment 304 beyond the maximum extension permitted by the first segment 302. For instance, the rim 303 can prevent the second segment 304 from disconnecting from the first segment 302. The first segment 302 can be affixed (e.g., by including the first segment 302 and/or the base 306 in a slot configured to receive the first segment 302) such that the second segment 304 is permitted to extend and compress when force is exerted on tip 305. For instance, if the spring pin connector 300 is disposed such that the second segment 304 is adjacent to a surface, the spring can force the second segment 304 to extend to contact the surface.

Figure 4A:
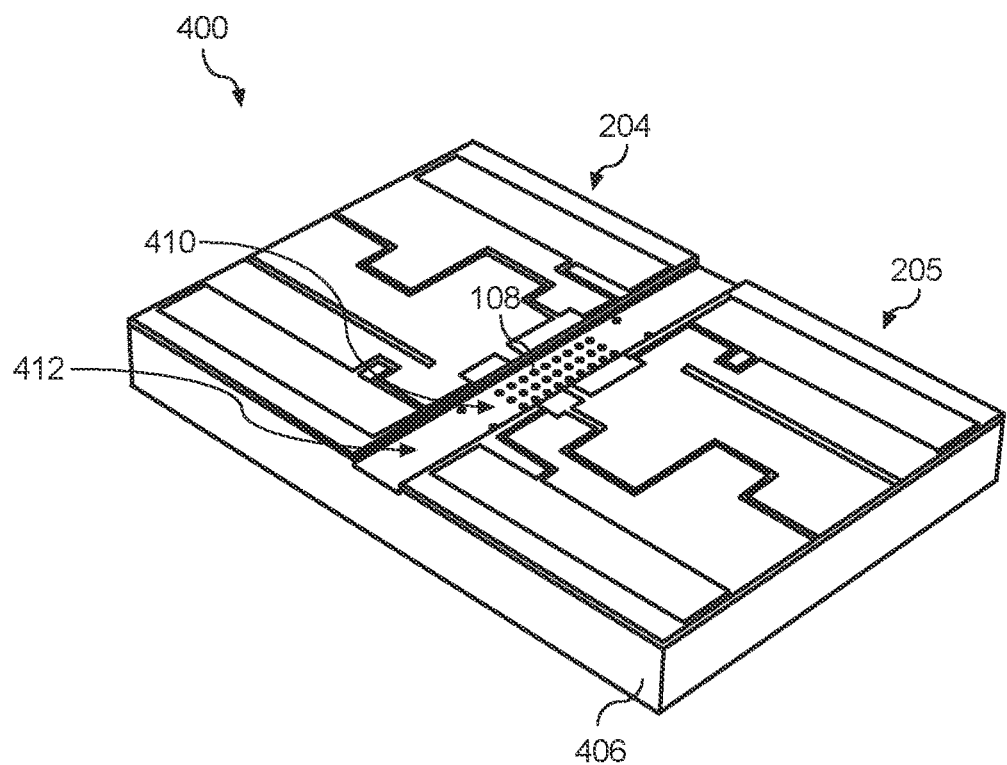
FIGS. 4A-4B depict an example system according to example embodiments of the present disclosure.
Figure 4B:
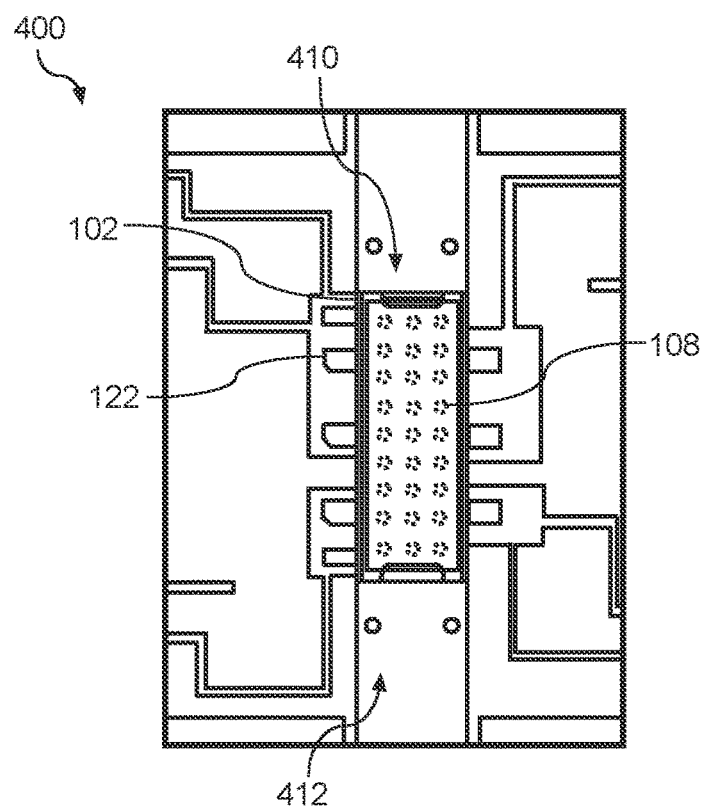

FIGS. 4A-4B depict an example system 400 according to example embodiments of the present disclosure. For instance, FIG. 4A illustrates a perspective view of system 400. FIG. 4B illustrates a top-down view of system 400. The system 400 includes a submount 406 including a recess 412 configured to accommodate at least a portion of the semiconductor package 102 (not illustrated in FIG. 4A). For instance, the recess 412 can be manufactured such that the circuit boards 204, 205 can be affixed to the submount 406 despite the recess 412. The recess 412 can include a region 410 having one or more holes drilled or otherwise formed to receive spring pin connectors 108. For instance, in some implementations, the region 410 can have a surface area that is about equivalent to (e.g., within about 90% of) a surface area defined by the metal contact 104 of the semiconductor package 102.

The spring pin connectors 108 can be arranged in any suitable configuration. For instance, although FIGS. 4A and 4B illustrate three columns of spring pin connectors 108 in region 410, the spring pin connectors 108 can be arranged in other suitable arrangements such as, for example, two columns, four or more columns, a single column, in a staggered configuration, or arbitrarily without a definite ordering.

Figure 5A:
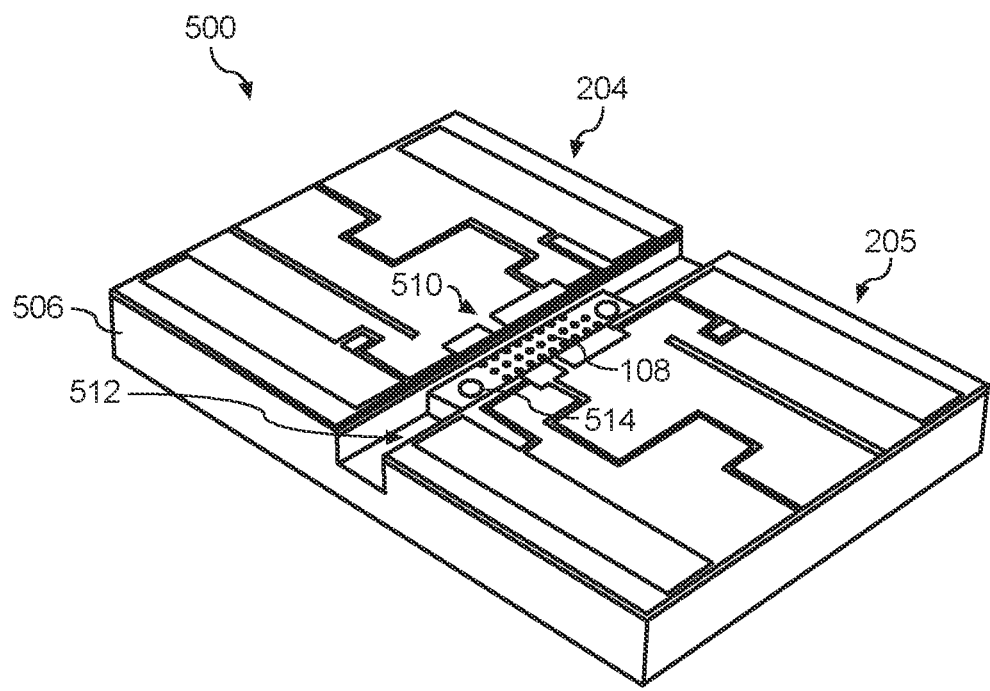
FIGS. 5A-5B depict an example system according to example embodiments of the present disclosure.
Figure 5B:
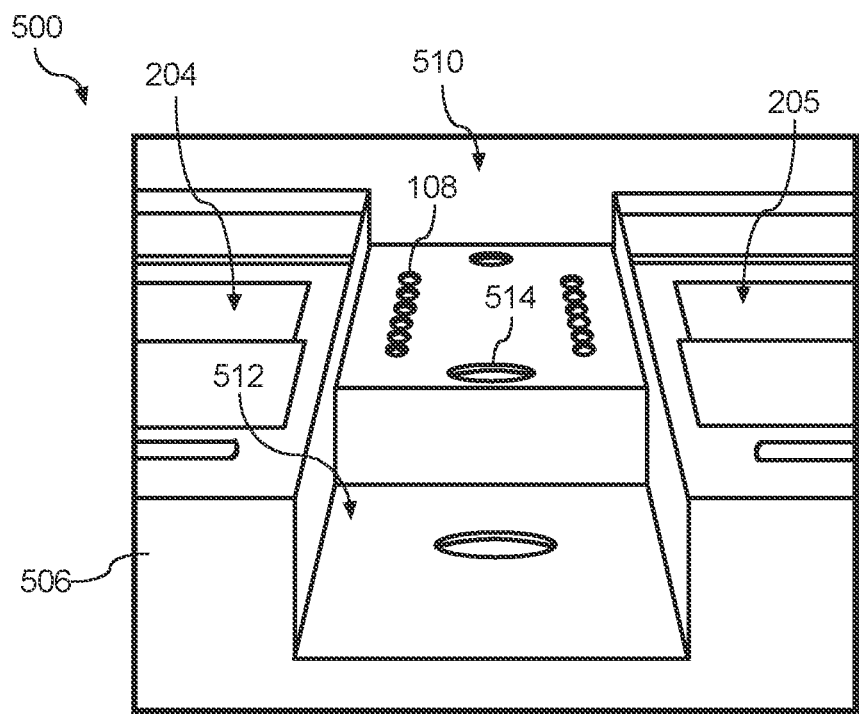

FIGS. 5A-5B depict an example system 500 according to example embodiments of the present disclosure. For instance, FIG. 5A illustrates a perspective view of system 500. FIG. 5B illustrates a close-up view of system 500. The system 500 includes a submount 506 including a metal insert 510 disposed in a groove 512. The metal insert 510 and the groove 512 can be provided between two circuit boards 204, 205 in an RF testing apparatus. For instance, the metal insert 510 can be configured such that ground current flows from the insert 510 to the portion of the submount 506 below the circuit boards 204, 205, as illustrated in FIG. 5B.

The insert 510 can be affixed to the larger portion of the submount 506 by any suitable means. In some embodiments, the metal insert 510 can be removably affixed to the system 500, such as by one or more screws 514. For instance, in the example system 500, the insert 510 can be secured by screws 514 to the larger portion of the submount 506. In some further embodiments, the metal insert 510 can be exchanged with other metal inserts having a same or similar footprint and/or different configurations (e.g., arrangements, types, fits, etc.) of spring pin connectors such that the system 500 can accommodate semiconductor packages having different arrangements of metal contacts than, for example, the semiconductor package 102. In some embodiments, the insert 510 can be soldered, welded, adhered, or otherwise attached to the larger portion of the submount 506.

Figure 6:
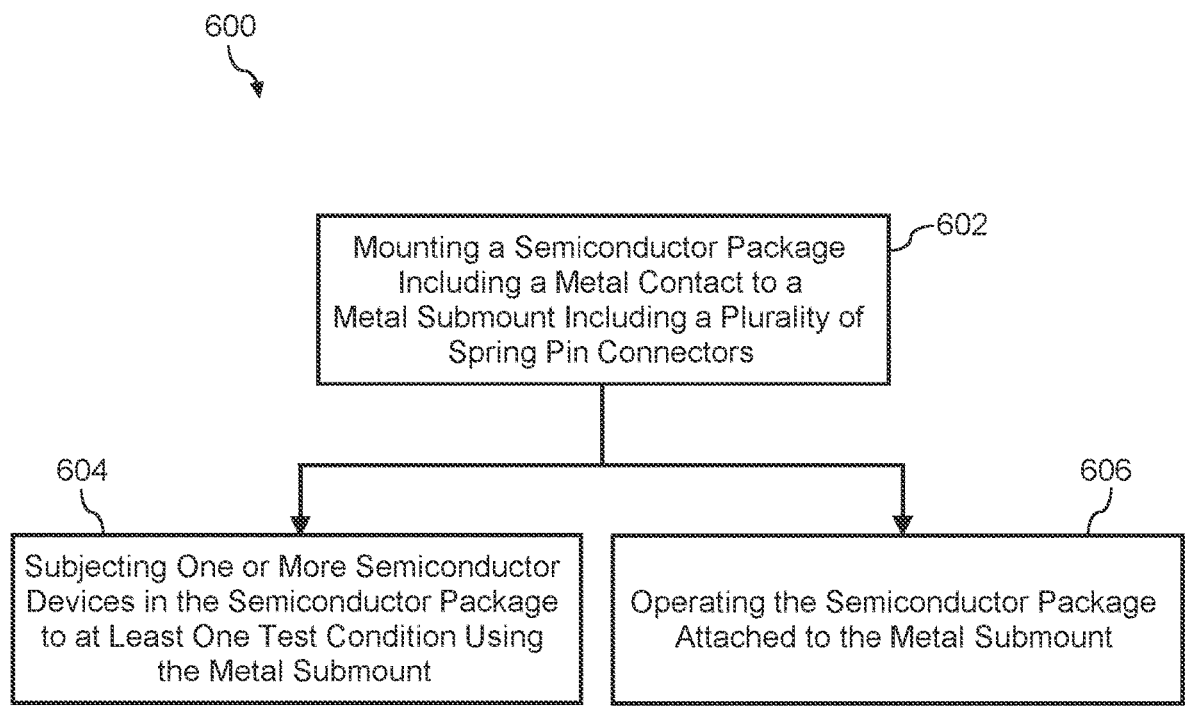
FIG. 6 depicts a flow diagram of an example method according to example embodiments of the present disclosure.

FIG. 6 depicts a flow diagram of an example method 600 according to example embodiments of the present disclosure. FIG. 6 depicts example process steps for purposes of illustration and discussion. Those of ordinary skill in the art, using the disclosures provided herein, will understand that process steps of any of the methods described in the present disclosure may be adapted, modified, include steps not illustrated, omitted, and/or rearranged without deviating from the scope of the present disclosure.

At 602, the method 600 can include mounting a semiconductor package including a metal contact to a metal submount. The metal submount can include a plurality of spring pin connectors embedded in the metal submount. The plurality of spring pin connectors can be thermally and electrically connected to one another through the metal submount. Example systems for mounting a semiconductor package including a metal contact to a metal submount are described herein with respect to FIGS. 1A-5B.

At 604, the method 600 can include subjecting one or more semiconductor devices in the semiconductor package to at least one test condition using the metal submount. For instance, circuit boards in communication with the metal submount can provide testing functionality for the semiconductor package. As one example, the circuit boards can simulate operation of a circuit implementing the semiconductor package. As another example, the circuit boards can test the semiconductor package under various loads, frequencies, temperatures, impulses, or other test conditions.

Additionally or alternatively, at 606, the method 600 can include operating the semiconductor package. For instance, the method can include operating the semiconductor package in a high frequency and/or high power radiofrequency application.

Figure 7:
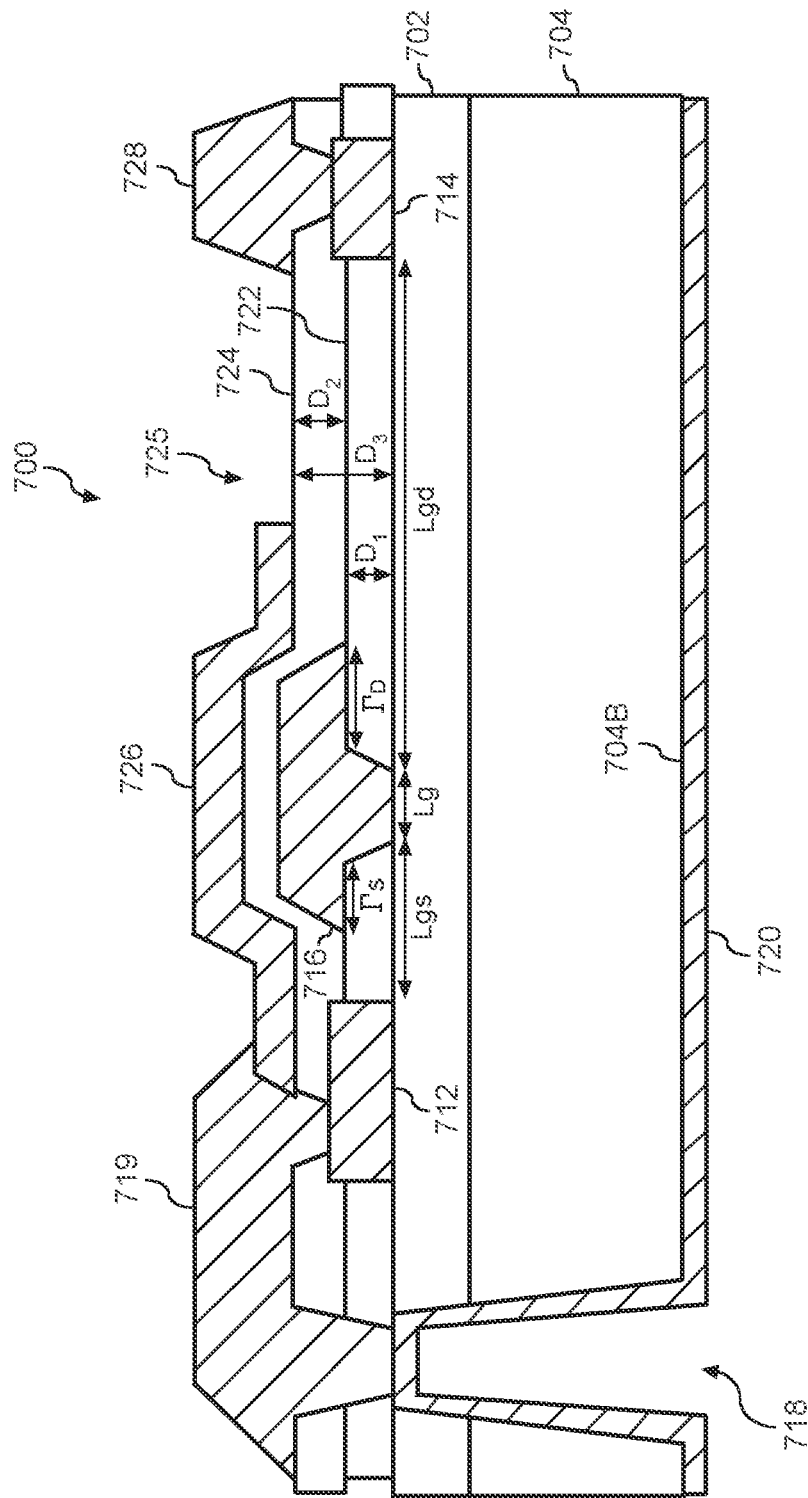
FIG. 7 depicts a cross-sectional view of an example semiconductor device according to example embodiments of the present disclosure.
Figure 8:
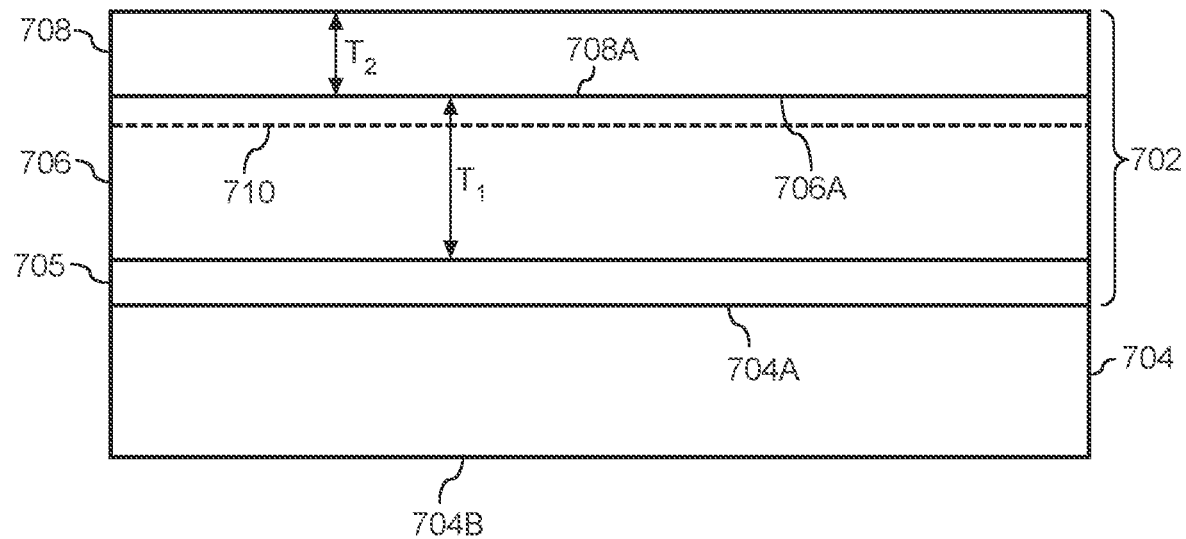
FIG. 8 depicts a cross-sectional view of an example semiconductor structure of a semiconductor device according to example embodiments of the present disclosure.

FIGS. 7-8 depict aspects of one example semiconductor device that may be included in a semiconductor package according to example embodiments of the present disclosure. FIGS. 7-8 are provided for purposes of illustration and discussion of one example semiconductor device (e.g., an HEMT) that may be included in a semiconductor package. A semiconductor package may include other suitable devices without deviating from the scope of the present disclosure.

FIG. 7 depicts a cross-sectional view of an example semiconductor device according to example embodiments of the present disclosure. FIG. 7 is intended to represent structures for identification and description and is not intended to represent the structures to physical scale. Semiconductor devices may be used in power electronics applications.

FIG. 7 depicts an example HEMT device 700 that may be included in a semiconductor package 102 according to example embodiments of the present disclosure. The HEMT device 700 may include a semiconductor structure 702. The semiconductor structure 702 may be a Group III-nitride semiconductor structure. Although FIG. 7 depicts a HEMT device 700, it should be understood that any suitable semiconductor device can be included in a semiconductor package 102 without departing from the scope of the present disclosure, such as, for example, silicon-carbide MOSFETs.

As used herein, the term "Group III nitride" refers to those semiconducting compounds formed between nitrogen (N) and the elements in Group III of the periodic table, usually aluminum (Al), gallium (Ga), and/or indium (In). The term also refers to ternary and quaternary (or higher) compounds such as, for example, AlGaN and AlInGaN. As is well understood by those in this art, the Group III elements may combine with nitrogen to form binary (e.g., GaN), ternary (e.g., AlGaN, AlInN), and quaternary (e.g., AlInGaN) compounds. These compounds all have empirical formulas in which one mole of nitrogen is combined with a total of one mole of the Group III elements.

The semiconductor structure 702 may be on a substrate 704. The substrate 704 may be a semiconductor material. For instance, the substrate 704 may be a silicon substrate, a silicon carbide (SiC) substrate, a sapphire substrate, or other suitable substrate. In some embodiments, the substrate 704 may be a semi-insulating SiC substrate that may be, for example, the 4H polytype of silicon carbide. Other SiC candidate polytypes may include the 3C, 6H, and 15R polytypes. The substrate may be a High Purity Semi-Insulating (HPSI) substrate, available from Wolfspeed, Inc. The term "semi-insulating" is used descriptively herein, rather than in an absolute sense.

In some embodiments, the SiC bulk crystal of the substrate 704 may have a resistivity equal to or higher than about $1 \times 10^5$ ohm-cm at room temperature. Example SiC substrates that may be used in some embodiments are manufactured by, for example, Wolfspeed, Inc., and methods for producing such substrates are described, for example, in U.S. Pat. No. Re. 34,861, U.S. Pat. Nos. 4,946,547, 5,200,022, and 6,218,680, the disclosures of which are incorporated by reference herein. Although SiC may be used as a substrate material, embodiments of the present disclosure may utilize any suitable substrate, such as sapphire ($Al_2O_3$), aluminum nitride (AlN), aluminum gallium nitride (AlGaN), gallium nitride (GaN), silicon (Si), GaAs, LGO, zinc oxide (ZnO), LAO, indium phosphide (InP), and the like. The substrate 704 may be a SiC wafer, and the HEMT device 700 may be formed, at least in part, via wafer-level processing, and the wafer may then be diced to provide a plurality of individual HEMT devices 700 that may include one or more transistor cells.

In some embodiments, the substrate 704 of the HEMT device 700 may be a thinned substrate 704. In some embodiments, the thickness of the substrate 704 (e.g., in a vertical Z direction in FIG. 7) may be about 100 µm or less, such as about 75 µm or less, such as about 50 µm or less.

FIG. 8 depicts a cross-sectional view of the semiconductor structure on the substrate 704. The semiconductor structure 702 may include a channel layer 706 on an upper surface 704A of the substrate 704 (or on the optional layers described further herein, such as an optional buffer or nucleation layer 705). The semiconductor structure 702 may include a barrier layer 708 on an upper surface of the channel layer 706. In some embodiments, the channel layer 706 and the barrier layer 708 may each be formed by epitaxial growth. Techniques for epitaxial growth of Group III-nitrides have been described in, for example, U.S. Pat. Nos. 5,210,051, 5,393,993, and 5,523,589, the disclosures of which are incorporated by reference herein. The channel layer 706 may have a bandgap that is less than the bandgap of the barrier layer 708. The channel layer 706 may have a larger electron affinity than the barrier layer 708. The channel layer 706 and the barrier layer 108 may include Group III nitride-based materials.

In some embodiments, the channel layer 706 may be a Group III-nitride, such as $Al_xGa_{1-x}N$, where $0 \leq x < 0.11$, provided that the energy of the conduction band edge of the channel layer 706 is less than the energy of the conduction band edge of the barrier layer 708 at the interface between the channel layer 706 and barrier layer 708. In some embodiments, the aluminum mole fraction x is approximately 0 (e.g., less than 5%, such as 0%), indicating that the channel layer 706 is GaN. The channel layer 706 may or may not include other Group III-nitrides such as InGaN, AlInGaN or the like. The channel layer 706 may be undoped ("unintentionally doped"). In some examples, the channel layer 706 may be doped, for instance with iron (Fe). The channel layer 706 may have a thickness $T_1$ of about 0.5 μm to about 5 μm, such as about 1.4 μm. The channel layer 706 may be a multi-layer structure, such as a superlattice or combinations of GaN, AlGaN or the like. The channel layer 706 may be under compressive strain in some embodiments.

The barrier layer 708 includes a Group III nitride-based layer having a surface 708A positioned on a surface 706A of the channel layer 706. The barrier layer 708 may be a Group III-nitride, such as $Al_yGa_{1-y}N$, where y is the aluminum mole fraction in the barrier layer 708. The energy of the conduction band edge of the barrier layer 708 is greater than the energy of the conduction band edge of the channel layer 706 at the interface between the channel layer 706 and barrier layer 708. In some embodiments, the aluminum mole fraction y is such that y is in a range of about 0.15 to about 0.30, such as about 0.20 to about 0.25, such as about 0.22 (e.g., the aluminum mole fraction is in a range of 15% to 30%, such as in a range of about 20% to about 25%, such as about 22%), indicating that the barrier layer is an AlGaN layer. The barrier layer 708 may include other Group III elements (e.g., In) without deviating from the scope of the present disclosure. The barrier layer 708, in some examples, may be a multilayer structure. The multilayer structure may include multiple Group III nitride-based layers with differing aluminum mole fractions. The barrier layer 708 may have a thickness $T_2$. The thickness $T_2$ may be in a range of about 10 Angstroms to about 300 Angstroms, such as about 120 Angstroms to about 170 Angstroms, such as about 150 Angstroms. The channel layer 706 and/or the barrier layer 708 may be deposited, for example, by metal-organic chemical vapor deposition (MOCVD), molecular beam epitaxy (MBE), or hydride vapor phase epitaxy (HVPE).

A 2DEG 710 may be induced in the channel layer 706 at an interface between the channel layer 706 and the barrier layer 708. The 2DEG 710 is highly conductive and allows conduction between the source and drain regions of the HEMT device 700.

While the HEMT device 700 of FIGS. 7-8 is shown with a substrate 704, channel layer 706 and barrier layer 708 for purposes of illustration, the HEMT device 700 may include additional layers/structures/elements. For instance, the HEMT device 700 may include a buffer layer(s)/nucleation layer(s)/transition layer(s) 705 between substrate 704 and the channel layer 706. For example, an AlN buffer layer may be on the upper surface 704A of the substrate 704 to provide an appropriate crystal structure transition between a SiC substrate 704 and the channel layer 706. The optional buffer/nucleation/transition layers 705 may be deposited by MOCVD, MBE, and/or HYPE.

The HEMT device 700 may include a cap layer (not illustrated) on the barrier layer 708. HEMT structures including substrates, channel layers, barrier layers, and other layers are discussed by way of example in U.S. Pat. Nos. 5,192,987, 5,296,395, 6,316,793, 6,548,333, 7,544,963, 7,548,112, 7,592,211, 7,615,774, 7,709,269, 7,709,859 and 10,971,612, the disclosures of which are incorporated by reference herein. Additionally, strain balancing transition layer(s) may also and/or alternatively be provided as described, for example, in U.S. Pat. No. 7,030,428, the disclosure of which is incorporated by reference herein.

Referring to FIG. 7, the HEMT device 700 may include a source contact 712 on the semiconductor structure 702 or otherwise contacting the semiconductor structure 702. The HEMT device 700 may include a drain contact 714 on the semiconductor structure 702 or otherwise contacting the semiconductor structure 702. The source contact 712 and the drain contact 714 may be laterally spaced apart from each other. In some embodiments, the source contact 712 and the drain contact 714 may include a metal that may form an ohmic contact to a Group III nitride-based semiconductor material. Suitable metals may include refractory metals, such as titanium (Ti), tungsten (W), titanium tungsten (TiW), silicon (Si), titanium tungsten nitride (TiWN), tungsten silicide (WSi), rhenium (Re), niobium (Nb), nickel (Ni), gold (Au), aluminum (Al), tantalum (Ta), molybdenum (Mo), NiSix, titanium silicide (TiSi), titanium nitride (TiN), tungsten silicon nitride (WsiN), platinum (Pt) and the like. In some embodiments, the source contact 712 may be an ohmic source contact 712. The drain contact 714 may be an ohmic drain contact 714. Thus, the source contact 712 and/or the drain contact 714 may include an ohmic contact portion in direct contact with the barrier layer 708. In some embodiments, the source contact 712 and/or the drain contact 714 may include a plurality of layers to form an ohmic contact that may be provided as described, for example, in U.S. Pat. Nos. 8,563,372 and 9,214,352, the disclosures of which are incorporated by reference herein.

The HEMT device 700 may include a gate contact 716 on the semiconductor structure 702 or otherwise contacting the semiconductor structure 702 (e.g., at least partially recessed into the semiconductor structure 702). The gate contact 716 may have a gate length $L_G$. The gate length $L_G$ may be the length of the gate contact 716 along the portion of the gate contact 716 that is on the semiconductor structure 702 (e.g., the length of the lowermost portion of the gate contact 716 in contact with the semiconductor structure 702). In some embodiments, the gate length $L_G$ may be about 200 nm or less, such as about 150 nm or less, such as in a range of about 60 nm to about 200 nm, such as in a range of about 90 nm to about 150 nm. A distance Lgd between the gate contact 716 and the drain contact 714 may be, for instance, in a range of 1.8 μm to about 2.2 μm, such as about 1.98 μm. A distance Lgs between the gate contact 716 and the source contact 712 may be, for instance, in a range of about 0.4 μm to about 0.8 μm, such as about 0.6 μm.

The material of the gate contact 716 may be chosen based on the composition of the barrier layer 708, and may, in some embodiments, be a Schottky contact. Materials capable of making a Schottky contact to a Group III nitride-based semiconductor material may be used, such as, for example, nickel (Ni), platinum (Pt), nickel silicide ($NiSi_x$), copper (Cu), palladium (Pd), chromium (Cr), tungsten (W) and/or tungsten silicon nitride (WSiN).

In some embodiments, the gate contact 716 may be a T-shaped gate and/or a gamma gate, the formation of which is discussed by way of example in U.S. Pat. Nos. 8,049,252, 7,045,404, and 8,120,064, the disclosures of which are incorporated by reference herein. The gate contact 716 may have an overhang toward the drain contact 714. The length $\Gamma_D$ of the overhang toward the drain contact 714 may be in a range of about 0.15 μm to about 0.25 μm, such as about 0.2

μm. The gate contact 716 may have an overhang toward the source contact 712. The length $L_{S\ of\ the\ overhang}$ toward the source contact 712 may be in a range of about 0.15 μm to about 0.25 μm, such as about 0.2 μm.

The source contact 712 may be coupled to a reference signal such as, for example, a ground voltage or other reference signal. The coupling to the reference signal may be provided by a via 718 that extends from a lower surface 704B of the substrate 704, through the substrate 704 and semiconductor structure 702 to the upper surface of the semiconductor structure 702. The via 718 may be coupled to a metal contact 719. The metal contact 719 may include metal or other highly conductive material, including, for example, copper, cobalt, gold, and/or a composite metal. The metal contact 719 may conductively couple the via 718 to the source contact 712. A back metal layer 720 may be on the lower surface 704B of the substrate 704 and on side walls of the via 718. The back metal layer 720 may be conductively coupled to the metal contact 719. Thus, the back metal layer 720, and a signal coupled thereto, may be electrically connected to the source contact 712 through the metal contact 719.

In some embodiments, the via 718 may have an oval or circular cross-section when viewed in a plan view. However, the present disclosure is not limited thereto. In some embodiments, a cross-section of the via 718 may be a polygon or other shape, as will be understood by one of ordinary skill in the art using the disclosures provided herein. In some embodiments, dimensions of the via (e.g., a length and/or a width) may be such that a largest cross-sectional area of the via 718 is about 1000 μm$^2$ or less. The cross-sectional area may be taken in a direction that is parallel to the lower surface 704B of the substrate 704 (e.g., the X-Y plane of FIG. 7). In some embodiments, the largest cross-sectional area of the via 718 may be that portion of the via 718 that is adjacent the lower surface 704B of the substrate 704 (e.g., the opening of the via 718). For example, in some embodiments, a greatest width (e.g., in the X direction in FIG. 7) may be about 16 μm and a greatest length (e.g., in the Y direction in FIG. 7) may be about 40 μm, though the present disclosure is not limited thereto. In some embodiments, sidewalls of the via 718 may be inclined and/or slanted with respect to the lower surface 704B of the substrate 704. In some embodiments, the sidewalls of the via 718 may be approximately perpendicular to the lower surface 704B of the substrate 704.

Depending on the embodiment, the drain contact 714 may be formed on, in and/or through the semiconductor structure 702, and there may be ion implantation into the materials around the drain contact 714 to reduce resistivity and provide improved ohmic contact to the semiconductor material. In yet other embodiments, there is no source via 718, and the source contact 712 is formed on, in and/or through the semiconductor structure 702, and there may be ion implantation in the materials around the source contact 712 to reduce resistivity and provide improved ohmic contact to the semiconductor material. Where there is no source via 718, the electrical connections to the source contact 712 may be made on the same side as the gate contact 716 and the drain contact 714. In some examples, the connections to the source contact 712, drain contact 714, and/or gate contact 716 may be made from the top and/or the bottom to provide for flip chip configuration of the HEMT device 700. In some examples, thermal paths may be provided from the top and/or bottom to provide for flip chip configuration of the HEMT device 700.

The HEMT device 700 may include a dielectric structure 725 on the semiconductor structure 702. The dielectric structure 725 may include a first dielectric layer 722 and a second dielectric layer. The first dielectric layer 722 may directly contact the upper surface of the semiconductor structure 702. At least a portion of the first dielectric layer 722 may be between the semiconductor structure 702 and at least a portion of the gate contact 716. For instance, at least a portion of the first dielectric layer 722 may be between the semiconductor structure 702 and the overhang of the gate contact 716. The first dielectric layer 722 may have a thickness $D_1$. In some embodiments, the thickness $D_1$ of the first dielectric layer 722 may be about 1450 Angstroms or less, such as in a range of about 800 Angstroms to about 1450 Angstroms, such as about 1200 Angstroms. In this way, the overhang of the T-shaped or Gamma-shaped gate contact 716 may be separated from the semiconductor structure 702 by a distance approximately equal to $D_1$. The first dielectric layer 722 may be a SiN layer. Other suitable dielectric materials may be used without deviating from the scope of the present disclosure. For instance, the first dielectric layer 722 may be $SiO_2$, Si, Ge, MgOx, MgNx, ZnO, SiNx, SiOx, alloys or layer sequences thereof, or epitaxial materials.

The dielectric structure 725 may include a second dielectric layer 724 on the first dielectric layer 722. The second dielectric layer 724 may be the same dielectric material or a different dielectric material relative to the first dielectric layer 722. For instance, the second dielectric layer may be a SiN layer. Other suitable dielectric materials may be used without deviating from the scope of the present disclosure. For instance, the second dielectric layer 724 may be $SiO_2$, Si, Ge, MgOx, MgNx, ZnO, SiNx, SiOx, alloys or layer sequences thereof, or epitaxial materials. The second dielectric layer 724 may have a thickness $D_2$. In some embodiments, the thickness $D_2$ of the second dielectric layer 724 may be about 2800 Angstroms or less, such as in a range of about 1500 Angstroms to about 2800 Angstroms, such as about 2100 Angstroms.

The dielectric structure 725 may have a thickness $D_3$. In some embodiments, the thickness $D_3$ of the dielectric structure may be about 3600 Angstroms or less, such as in a range of about 3000 Angstroms to about 3600 Angstroms, such as about 3300 Angstroms.

One or more field plates 726 may be on the dielectric structure 725 as illustrated in FIG. 7. At least a portion of a field plate 726 may be overlapping the gate contact 716. At least a portion of the field plate 726 may be on a portion of the second dielectric layer 724. In some embodiments, the field plate 726 may be conductively coupled to the gate contact 716. The field plate 726 may reduce the peak electric field in the HEMT device 700, which may result in increased breakdown voltage and reduced charge trapping. The reduction of the electric field may also yield other benefits such as reduced leakage currents and enhanced reliability. Field plates and techniques for forming field plates are discussed, by way of example, in U.S. Pat. No. 8,120,064, the disclosure of which is incorporated by reference herein.

The field plate 726 may be separated from the semiconductor structure by a distance approximately equal to $D_3$. The distance $D_3$ may increase the effectiveness of the field plate 726 in reducing the electric field in the semiconductor structure 702, leading to higher electron mobility in the 2DEG 710 and increased performance of the HEMT device 700.

Moreover, the decrease in $D_1$ and in $D_3$ of the HEMT device 700 may lead to a reduction in drain-gate capacitance and/or gate-source capacitance of the HEMT device 700.

This may be particularly true in embodiments where the field plate 726 is conductively coupled to the gate contact 716. The reduction in drain-gate capacitance and/or gate-source capacitance of the HEMT device 700 may lead to improved performance of the HEMT device 700 at high frequency conditions (e.g., 30 GHz or greater)

Metal contacts 719 and 728 may be in the dielectric structure 725 as illustrated in FIG. 7. The metal contacts 719 and 728 may provide interconnection between the source contact 712, drain contact 714, gate contact 716, and other parts of the HEMT device 700. Metal contact 719 may be conductively coupled to the source contact 712. Metal contact 728 may be conductively coupled to the drain contact 714. The metal contacts 719 and 728 may include metal or other highly conductive material, including, for example, copper, cobalt, gold, and/or a composite metal.

A HEMT transistor cell may be formed by the active region between the source contact 712 and the drain contact 714 under the control of the gate contact 716 between the source contact 712 and the drain contact 714. FIG. 7 depicts a cross-sectional view of one unit or cell of an HEMT device 700 for purposes of illustration. The HEMT device unit or cell may be formed adjacent to additional HEMT device cells and may share, for instance, a source contact 712 with adjacent HEMT device cells. The HEMT device 700 may be formed, at least in part, via wafer-level processing, and the wafer may then be diced to provide individual semiconductor die including one or more individual HEMT devices 700. The individual semiconductor die may be packaged, for instance, to provide the semiconductor package 102.

Example embodiments of the present disclosure are set forth below. Any of the below features or examples may be used in combination with any of the embodiments or features provided in the present disclosure.

One example embodiment of the present disclosure is directed to system. The system includes a semiconductor package having a metal contact. The system includes a metal submount. The metal submount includes a plurality of spring pin connectors embedded in the metal submount, the plurality of spring pin connectors being thermally and electrically connected to one another through the metal submount. The metal contact of the semiconductor package is thermally and electrically coupled to the metal submount through the plurality of spring pin connectors.

In some embodiments, the metal contact of the semiconductor package includes a cooling pad associated with the semiconductor package. In some embodiments, the metal contact is a planar metal contact. In some embodiments, the metal contact has a surface area of at least about 50% of a surface area of a surface of the semiconductor package. In some embodiments, the metal contact has a surface area of at least about 75% of a surface area of a surface of the semiconductor package. In some embodiments, the metal contact is associated with an electrical reference connection for the semiconductor package.

In some embodiments, the metal submount comprises a heat sink. In some embodiments, the metal submount provides an electrical reference connection for the semiconductor package.

In some embodiments, the metal submount is disposed adjacent one or more circuit boards. In some embodiments, the semiconductor package comprises one or more electrical leads connected to the one or more circuit boards.

In some embodiments, the metal submount comprises a recess configured to accommodate at least a portion of the semiconductor package. In some embodiments, the metal submount is a metal insert disposed in a groove provided between two circuit boards in an RF testing apparatus.

In some embodiments, the semiconductor package includes a wide band gap semiconductor-based power semiconductor device. In some embodiments, the semiconductor package includes one or more silicon-carbide MOSFETs. In some embodiments, the semiconductor package includes one or more Group III nitride-based devices. In some embodiments, the one or more Group-III nitride-based devices comprises one or more Group III nitride-based HEMTs.

In some embodiments, the semiconductor package is a channel mount power semiconductor package. In some embodiments, the metal contact of the semiconductor package is thermally and electrically coupled to the metal submount without use of a medium between the metal contact and the metal submount. In some embodiments, the metal submount comprises copper or silver.

Another example embodiment of the present disclosure is directed to a testing apparatus for a power semiconductor package. The testing apparatus includes a metal submount. The testing apparatus includes a plurality of spring pin connectors embedded in the metal submount. The plurality of spring pin connectors may be thermally and electrically connected to one another through the metal submount.

In some embodiments, the metal submount includes a heat sink. In some embodiments, the metal submount is disposed adjacent one or more circuit boards. In some embodiments, the metal submount comprises a metal insert disposed in a groove provided between two circuit boards in the testing apparatus. In some embodiments, the metal submount comprises copper or silver.

In some embodiments, the metal submount is configured to receive a metal contact of a semiconductor package. In some embodiments, the metal submount provides an electrical reference connection for the semiconductor package. In some embodiments, the metal submount comprises a recess configured to accommodate at least a portion of the semiconductor package.

In some embodiments, the semiconductor package includes a wide band gap semiconductor-based power semiconductor device. In some embodiments, the semiconductor package includes one or more silicon-carbide MOSFETs. In some embodiments, the semiconductor package includes one or more Group III nitride-based devices. In some embodiments, the one or more Group-III nitride-based devices comprises one or more Group III nitride-based HEMTs.

In some embodiments, the semiconductor package is a channel mount power semiconductor package. In some embodiments, the metal contact of the semiconductor package is thermally and electrically coupled to the metal submount without use of a medium between the metal contact and the metal submount. In some embodiments, the metal submount comprises copper or silver.

Another example embodiment of the present disclosure is directed to a method. The method includes mounting a semiconductor package including a metal contact to a metal submount. The metal submount includes a plurality of spring pin connectors embedded in the metal submount. The plurality of spring pin connectors may be thermally and electrically connected to one another through the metal submount.

In some embodiments, the metal contact comprises a planar metal contact.

In some embodiments, the method further includes subjecting one or more semiconductor devices in the semiconductor package to at least one test condition using the metal submount.

In some embodiments, the method further includes operating the semiconductor package attached to the metal submount.

In some embodiments, the semiconductor package includes a wide band gap semiconductor-based power semiconductor device. In some embodiments, the semiconductor package includes one or more silicon-carbide MOSFETs. In some embodiments, the semiconductor package includes one or more Group III nitride-based devices. In some embodiments, the one or more Group-III nitride-based devices comprises one or more Group III nitride-based HEMTs.

In some embodiments, the semiconductor package is a channel mount power semiconductor package. In some embodiments, the metal contact of the semiconductor package is thermally and electrically coupled to the metal submount without use of a medium between the metal contact and the metal submount. In some embodiments, the metal submount comprises copper or silver.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A system, comprising:
   a semiconductor package comprising a metal contact;
   a metal submount;
   a plurality of spring pin connectors embedded in the metal submount, the plurality of spring pin connectors being thermally and electrically connected to one another through the metal submount; and
   wherein the metal contact of the semiconductor package is thermally and electrically coupled directly to the metal submount and the plurality of spring pin connectors.

2. The system of claim 1, wherein the metal contact of the semiconductor package comprises a cooling pad associated with the semiconductor package.

3. The system of claim 1, wherein the metal contact comprises a planar metal contact.

4. The system of claim 1, wherein the metal contact has a surface area of at least about 50% of a surface area of a bottom surface of the semiconductor package.

5. The system of claim 1, wherein the metal contact bas a surface area of at least about 75% of a surface area of a bottom surface of the semiconductor package.

6. The system of claim 1, wherein the metal contact is associated with an electrical reference connection for the semiconductor package.

7. The system of claim 1, wherein the metal submount comprises a heat sink.

8. The system of claim 1, wherein the metal submount provides an electrical reference connection for the semiconductor package.

9. The system of claim 1, wherein the metal submount is disposed adjacent one or more circuit boards.

10. The system of claim 1, wherein the semiconductor package comprises one or more electrical leads connected to the one or more circuit boards.

11. The system of claim 1, wherein the metal submount comprises a recess configured to accommodate at least a portion of the semiconductor package.

12. The system of claim 1, wherein the metal submount comprises a metal insert disposed in a groove provided between two circuit boards in an RF testing apparatus.

13. The system of claim 1, wherein the semiconductor package comprises one or more silicon-carbide MOSFETs.

14. The system of claim 1, wherein the semiconductor package comprises one or more Group III nitride-based devices.

15. The system of claim 14, wherein the one or more Group-III nitride-based devices comprises one or more Group III nitride-based high electron mobility transistors (HEMTs).

16. The system of claim 1, wherein the semiconductor package comprises a channel mount power semiconductor package.

17. The system of claim 1, wherein the metal submount comprises copper or silver.

18. A testing apparatus for a power semiconductor package, comprising:
   a metal submount; and
   a plurality of spring pin connectors embedded in the metal submount, the plurality of spring pin connectors being thermally and electrically connected to one another through the metal submount;
   wherein a metal contact of the power semiconductor package is thermally and electrically coupled directly to the metal submount and the plurality of spring pin connectors.

19. A method, comprising:
   mounting a semiconductor package including a metal contact to a metal submount, a plurality of spring pin connectors being embedded in the metal submount, the plurality of spring pin connectors being thermally and electrically connected to one another through the metal submount; and
   wherein the metal contact is thermally and electrically coupled directly to the metal submount and the plurality of spring pin connectors.

* * * * *